United States Patent
Rajendran et al.

(10) Patent No.: US 8,143,955 B2
(45) Date of Patent: Mar. 27, 2012

(54) OSCILLATOR CIRCUIT FOR RADIO FREQUENCY TRANSCEIVERS

(75) Inventors: Gireesh Rajendran, Karnataka (IN); Debapriya Sahu, Karnataka (IN); Alok Prakash Joshi, Karnataka (IN); Ashish Lachhwani, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/699,906

(22) Filed: Feb. 4, 2010

(65) Prior Publication Data

US 2011/0187463 A1    Aug. 4, 2011

(51) Int. Cl.
*H03L 7/00* (2006.01)

(52) U.S. Cl. .................. 331/2; 331/46; 331/47; 331/48; 331/49; 331/53; 331/179; 327/156; 327/105; 455/260; 332/124; 332/127

(58) Field of Classification Search .............. 331/2, 179, 331/46, 47, 48, 49, 53; 327/105, 156; 332/127, 332/124; 455/260
See application file for complete search history.

(56) References Cited

U.S. PATENT DOCUMENTS

| | | | | |
|---|---|---|---|---|
| 5,373,256 A | * | 12/1994 | Nicotra et al. | 331/2 |
| 7,545,224 B2 | * | 6/2009 | Chow et al. | 331/22 |

* cited by examiner

*Primary Examiner* — Arnold Kinkead
(74) *Attorney, Agent, or Firm* — Ronald O. Neerings; Wade James Brady, III; Frederick J. Telecky, Jr.

(57) ABSTRACT

Oscillator circuit for radio frequency transceivers. An oscillator circuit includes a first oscillator that generates a signal having a first frequency and a second oscillator that generates a signal having a second frequency. The oscillator circuit includes a mixer that is responsive to the signal having the first frequency and the signal having the second frequency to provide a signal having a third frequency and one or more frequency components. The oscillator circuit includes a filter that is responsive to the signal from the mixer to attenuate the one or more frequency components and provide a signal having a desired frequency. The oscillator circuit includes a correction circuit to correct a drift in at least one of the first frequency and the second frequency by controlling the second frequency, thereby correcting the drift in the third frequency and the desired frequency.

20 Claims, 2 Drawing Sheets

US 8,143,955 B2

OSCILLATOR CIRCUIT FOR RADIO FREQUENCY TRANSCEIVERS

TECHNICAL FIELD

Embodiments of the disclosure relate to an oscillator circuit.

BACKGROUND

Oscillator circuits are used in radio frequency (RF) transceivers for radio communication. An oscillator circuit generates a signal that is used to convert frequency of an RF signal to another frequency using a mixer. In one example, the oscillator circuit generates an in-phase signal and a quadrature phase signal to down-convert the RF signal provided to an RF transceiver. The oscillator circuit down-converts the RF signal to an in-phase intermediate frequency signal and a quadrature phase intermediate frequency signal. In another example, the oscillator circuit generates the in-phase signal and the quadrature phase signal to up-convert two channels of a baseband signal for transmission. The baseband signal can be defined as a signal whose frequency is close to desired transmission or reception bandwidth. The baseband signal after up-conversion can be amplified using a power amplifier. Often, the signal after amplification has a frequency similar or in harmonic or in sub-harmonic relation to a frequency of the signal generated from the oscillator circuit and can cause frequency drift in the oscillator circuit. The frequency, of the signal after amplification, having the harmonic or the sub-harmonic relation can be referred to as harmonic frequency.

In one existing technique, the oscillator circuit includes multiple oscillators. Each oscillator can be coupled to a phase locked loop to correct the frequency drift. However, having multiple phase locked loops consumes power and increases area in an integrated circuit.

In another existing technique, the harmonic frequency is filtered out using a filter, for example a band pass filter. However, in applications of the RF transceiver where use of multiple frequency bands is desired, the harmonic frequency that is filtered out can belong to one of desired frequency band. For example, in a mobile phone that uses a global positioning system (GPS) frequency band and a global navigation satellite system (GLONASS) frequency band, a signal in the GPS frequency band can have a frequency whose harmonic is present in the GLONASS frequency band, thereby causing interference in the GLONASS frequency band. Further, signals in the GLONASS frequency band can be lost if the harmonic frequency is filtered out.

SUMMARY

An example of an oscillator circuit includes a first oscillator that generates a signal having a first frequency and a second oscillator that generates a signal having a second frequency. The oscillator circuit also includes a mixer coupled to the first oscillator and the second oscillator, and responsive to the signal having the first frequency and the signal having the second frequency to provide a signal having a third frequency and one or more frequency components. Further, the oscillator circuit includes a filter coupled to the mixer, and responsive to the signal from the mixer to attenuate the one or more frequency components and provide a signal having a desired frequency. The oscillator circuit also includes a correction circuit coupled to the second oscillator and the filter to correct a drift in at least one of the first frequency and the second frequency by controlling the second frequency, thereby correcting the drift in the third frequency and the desired frequency.

An example of an oscillator circuit includes a first oscillator that generates a signal having a first frequency. The oscillator circuit includes a second oscillator that generates a signal having a second frequency. The oscillator circuit includes a mixer coupled to the first oscillator and the second oscillator, and responsive to the signal having the first frequency and the signal having the second frequency to provide a signal having a third frequency and one or more frequency components. The oscillator circuit includes a filter coupled to the mixer, and responsive to the signal from the mixer to attenuate the one or more frequency components and provide a signal having a desired frequency. The oscillator circuit includes a first switch coupled to the filter to selectively output the signal having the desired frequency. The oscillator circuit includes a phase error detector that generates an error signal corresponding to magnitude of a drift in the third frequency and the desired frequency. The oscillator circuit includes an integrator coupled to the phase error detector to filter the error signal. The oscillator circuit includes a second switch coupled between the phase error detector and the first switch, and that is configurable, in conjunction with the first switch, to render the phase error detector, the integrator and the second oscillator to correct the drift in the third frequency and the desired frequency by controlling the second frequency.

An example of an oscillator circuit includes a first oscillator in an open loop configuration. The oscillator circuit includes a second oscillator in a closed loop configuration. The oscillator circuit includes a mixer coupled to the first oscillator and the second oscillator, and responsive to signals from the first oscillator and the second oscillator to provide an output signal. The oscillator circuit also includes a correction circuit coupled to the second oscillator and the mixer, and responsive to the output signal to correct a drift in a frequency of the output signal by controlling output of the second oscillator.

BRIEF DESCRIPTION OF THE VIEWS OF DRAWINGS

DETAILED DESCRIPTION OF THE EMBODIMENTS

A transceiver, for example a radio frequency (RF) transceiver, operates in multiple frequency bands in various applications. An example of an application that requires operation of the transceiver in the multiple frequency bands includes a mobile phone. Examples of the multiple frequency bands include, but are not limited to, an industrial, scientific, medical (ISM) frequency band. In one embodiment, the transceiver that operates in the multiple frequency bands can be referred to as a multi-band transceiver. The transceiver including various elements is explained in conjunction with FIG. 1.

Figure 1:
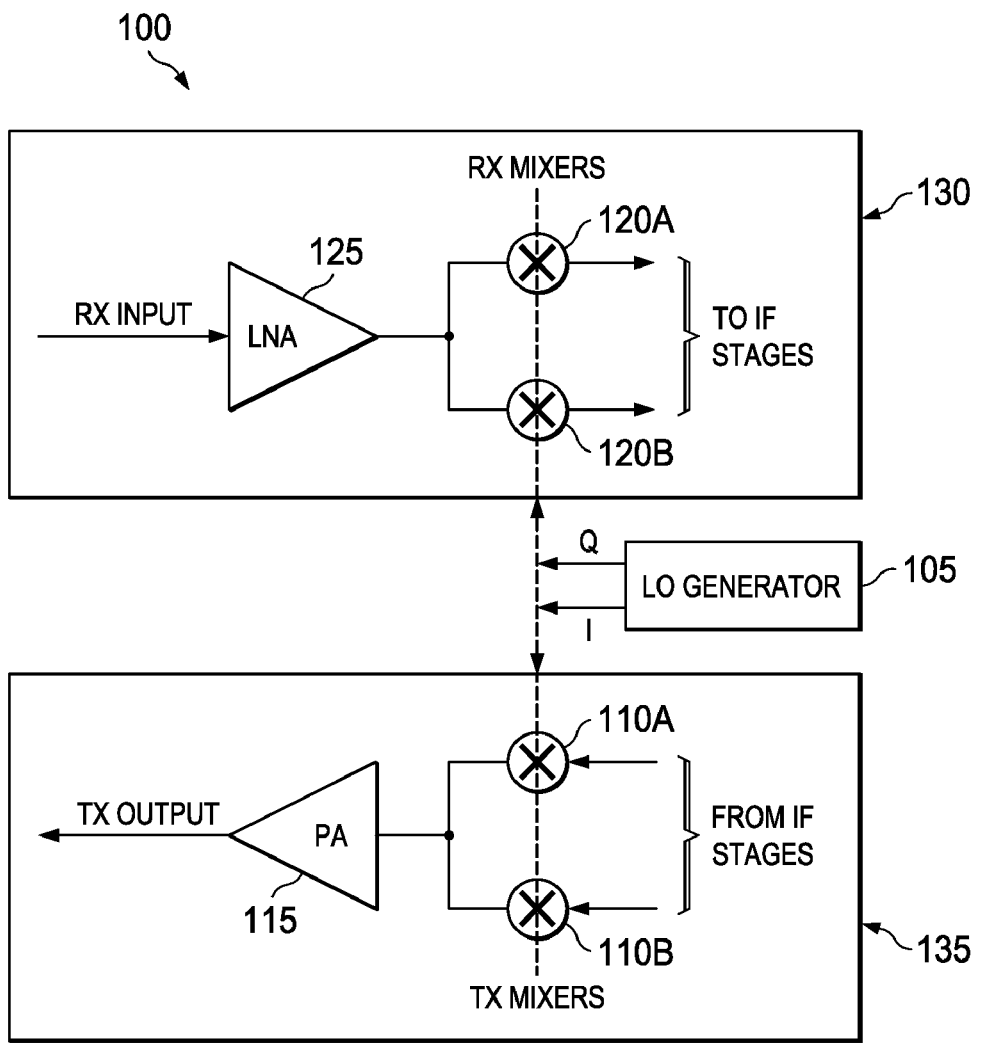
FIG. 1 illustrates a multi-band transceiver, in accordance with one embodiment.

Referring to FIG. 1, a transceiver 100 includes a receiving portion 130 and a transmitting portion 135. The receiving portion 130 includes a low noise amplifier (LNA) 125. One terminal of the LNA 125 receives an RF input signal (RX INPUT). Another terminal of the LNA 125 is coupled to one or more mixers, for example a mixer 120A and a mixer 120B, hereinafter collectively referred to as receiver mixers (RX Mixers). The transmitting portion 135 includes a power amplifier 115. One terminal of the power amplifier 115 is coupled to one or more mixers, for example a mixer 110A and a mixer 110B, hereinafter collectively referred to as the transmitter mixers (TX Mixers). Another terminal of the power amplifier 115 transmits an amplified output signal (TX OUTPUT). The transceiver 100 also includes a local oscillator generator (LO generator), hereinafter referred to as oscillator circuit 105, coupled to the RX mixers (the mixer 120A and the mixer 120B) and the TX mixers (the mixer 110A and the mixer 110B).

The oscillator circuit 105 generates an in-phase (I) signal and a quadrature phase (Q) signal. The in-phase signal and the quadrature phase signal are provided to the TX mixers (the mixer 110A and the mixer 110B) to up-convert frequency of a baseband signal received from an intermediate frequency (IF) stage. The baseband signal can be defined as a signal whose frequency is close to desired transmission or reception bandwidth. An up-converted signal is amplified by the power amplifier 115. The in-phase signal and the quadrature phase signal are provided to the RX mixers (the mixer 120A and the mixer 120B) to down-convert frequency of the RF input signal. In one embodiment, frequency conversion can also be referred to as heterodyning. Heterodyning results in either sum of or difference between the frequency of the oscillator circuit 105 and a frequency of a desired signal. The desired signal can be referred to as either signal from the LNA 125 or the baseband signal from the IF stage.

It is noted that the transceiver 100, the receiving portion 130, and the transmitting portion 135 can include more elements than that illustrated in FIG. 1.

The frequency of the oscillator circuit 105, hereinafter referred to as LO frequency, can drift over a period of time. The drift in the LO frequency can be due to temperature variations or due to effect of other elements in the transceiver 100. In one example, the signal amplified by the power amplifier 115 can have a frequency similar or in harmonic or in sub-harmonic relation to the LO frequency and can cause a drift in the LO frequency. The frequency, of the signal amplified, having the harmonic or the sub-harmonic relation to the LO frequency can be referred to as a harmonic frequency. The oscillator circuit 105 compensates for the drift in the LO frequency by using a first oscillator in an open loop configuration and a second oscillator in a closed loop configuration. The oscillator circuit 105 including one oscillator in the open loop configuration and another oscillator in the closed loop configuration for correcting the drift in the LO frequency is explained in conjunction with FIG. 2.

Figure 2:
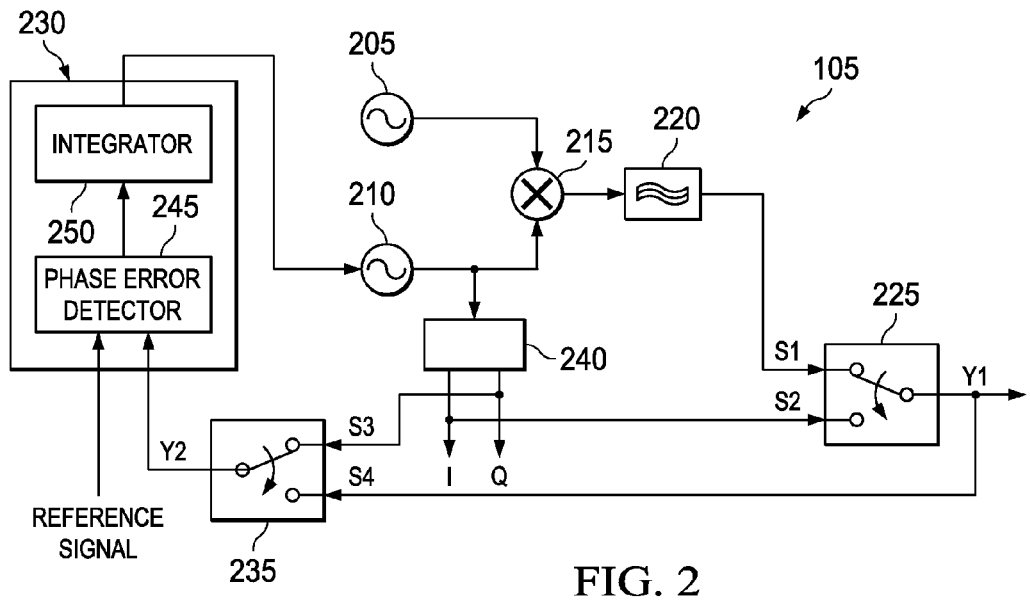
FIG. 2 illustrates an oscillator circuit used in multi-band transceivers, in accordance with one embodiment.

Referring to FIG. 2, the oscillator circuit 105 includes one or more oscillators, for example a first oscillator 205, hereinafter referred to as the oscillator 205 and a second oscillator 210, hereinafter referred to as the oscillator 210. The oscillator circuit 105 includes a mixer 215 coupled to the oscillator 205 and the oscillator 210. Further, the oscillator circuit 105 includes a filter 220 coupled to the mixer 215. The oscillator circuit 105 also includes a first switch 225, hereinafter referred to as the switch 225, coupled to the filter 220. The oscillator circuit 105 includes a correction circuit 230 coupled to the oscillator 210 and also coupled to the switch 225. In some embodiments, the correction circuit 230 can be coupled to the switch 225 through another switch 235 (second switch). In one embodiment, the switch 225 and the switch 235 are metal oxide semiconductor transistor switches. In some embodiments, the switch 225 and the switch 235 can be implemented using logic gates, for example using an AND logic gate. The oscillator circuit 105 also includes a frequency divider 240 coupled to the oscillator 210 and the switch 225. In some embodiments, the frequency divider 240 can also be coupled to the switch 235.

In one embodiment, the oscillator 205 can be in an open loop configuration having no feedback paths and the oscillator 210 can be in a closed loop configuration having one or more feedback paths. In one embodiment, the oscillator 210, the mixer 215, the correction circuit 230, the switch 225, and the switch 235 form the closed loop configuration.

The oscillator circuit 105 can be operated in a low power transmit mode, a high power transmit mode, and a receive mode. In one example, for a bluetooth transmitter in the low power transmit mode, the oscillator circuit 105 can be operated with power less than 0 decibel milliwatt (dBm). In another example, for the bluetooth transmitter in the high power transmit mode, the oscillator circuit 105 can be operated with power more than 0 dBm. The oscillator 205 is active in the high power transmit mode and is inactive in the low power transmit mode and the receive mode. The oscillator 210 is active in the low power transmit mode, the high power transmit mode, and the receive mode.

The oscillator 205 generates a signal having a first frequency and the oscillator 210 generates a signal having a second frequency. In one example, the first frequency and the second frequency can be pre-defined. The oscillator 205 can be a narrow tuning range oscillator. The first frequency can be generated based on equation 1 given below, $$F_{osc1} = (n1 \times F_{lo}) \pm (F_{lo} \div k1) \quad (1)$$

where n1 is an integer, for example, n1=2, 4 . . . , k1 is an integer or a fractional number, $F_{lo}$ is a predetermined frequency.

The oscillator 210 can be a voltage controlled oscillator that generates the second frequency based on an input voltage. The oscillator 210 can be a wide tuning range oscillator. The second frequency can be generated in the high power transmit mode based on equation 2 given below, $$F_{osc2} = (n2 \times F_{lo}) \mp (F_{lo} \div k2) \quad (2)$$

where n2 is an integer, for example, n2=2, 4 . . . , k2 is an integer or a fractional number, and $F_{lo}$ is the predetermined frequency.

The second frequency can be generated in the low power transmit mode or the receive mode based on equation 3 given below, $$F_{osc2} = (M \times F_{lo}) \quad \text{Equation (3)}$$

where m is an integer.

The oscillator frequency of the oscillator 210 ($F_{osc2}$) can be predefined based on a mode of operation of the oscillator circuit 105. For example, in the high power transmit mode, the oscillator frequency of the oscillator 210 ($F_{osc2}$) is predefined based on the equation 2 and in the low power transmit mode or the receive mode, the oscillator frequency of the oscillator 210 ($F_{osc2}$) is predefined based on the equation 3. Further, selection of modes can be controlled by the switch 225 and the switch 235.

The mixer 215 is responsive to the signal having the first frequency and the signal having the second frequency to provide a signal having a third frequency (output signal). The third frequency can be either the sum of or the difference between the first frequency and the second frequency. The mixer 215 can also include one or more frequency components that are undesired frequencies. Further, the frequency components need to be filtered out. The filter 220 is responsive to the signal from the mixer to attenuate the frequency components and provide a signal having a desired frequency. In one embodiment, the desired frequency is provided for up-conversion of the baseband signal.

In one example, $F_{lo}$ is predefined as 2.4 Giga Hertz (GHz). For n=2, the first frequency can be calculated using the equation 1 as, $$F_{osc1}=(2\times2.4)+(2.4\div2)$$

$$F_{osc1}=6\text{ GHz}$$

Similarly, the second frequency can be calculated using the equation 2 as, $$F_{osc2}=(2\times2.4)-(2.4\div2)$$

$$F_{osc1}=3.6\text{ GHz}$$

The first frequency=6 GHz and the second frequency=3.6 GHz is provided to the mixer 215. The mixer can provide the third frequency along with the frequency components. The third frequency with the frequency components can be calculated as, $$6\text{ GHz}+3.6\text{ GHz}=9.6\text{ GHz}$$

$$6\text{ GHz}-3.6\text{ GHz}=2.4\text{ GHz}$$

In one example, 9.6 GHz can be a frequency component and 2.4 GHz can be the desired frequency. In one example, the filter 220 filters out 9.6 GHz as it is not the desired frequency. The filter 220 then provides the desired frequency, for example 2.4 GHz. In another example, the desired frequency, for example 2.4 GHz, can be considered as the third frequency.

The switch 225 and the switch 235 are uni-directional switches and include multiple input ports and an output port. For example, the switch 225 can have input ports S1 and S2 and an output port Y1. Likewise, the switch 235 can have input ports S3 and S4 and an output port Y2. The switch 225 and the switch 235 are configurable to provide the third frequency as feedback signal for the correction circuit 230.

In one embodiment, the drift in the third frequency and in turn in the desired frequency can occur due to a drift in the first frequency generated by the oscillator 205 or due to a drift in the second frequency generated by the oscillator 210. In another embodiment, the drift in the third frequency and in turn in the desired frequency can occur due to the drift in both the first frequency and the second frequency. The drift in the third frequency and the desired frequency can be corrected by the correction circuit 230, the oscillator 210, the filter 220, the switch 235 and the switch 225 by controlling the second frequency. The signal having the third frequency is provided to the correction circuit 230 through path S1Y1 of the switch 225 and path 54Y2 of the switch 235. After the drift is corrected the desired frequency can then be outputted through the switch 225. The correction circuit 230 also corrects any drift in the phase of the signal having the third frequency or the desired frequency by controlling the second frequency.

In the high power transmit mode, the frequency of the oscillator 205 (first frequency) or the frequency of the oscillator 210 (second frequency) can drift. The drift in the frequency of the oscillator 205 or the oscillator 210 can result in the drift of the third frequency or the desired frequency. The signal having the third frequency is provided to the correction circuit 230 through the path S1Y1 of the switch 225 and the path S4Y2 of the switch 235. The correction circuit 230 corrects the drift in the first frequency or the second frequency, thereby correcting the drift in the third frequency.

After correcting the drift, the third frequency or the desired frequency can be provided for up-conversion of the baseband signal in the high power transmit mode. In some embodiments, the third frequency is passed through the frequency divider 240 and is provided for up-conversion of the baseband signal in the high power transmit mode.

In the low power transmit mode, the frequency of the oscillator 210 (second frequency) can drift. The signal having the second frequency is provided to the correction circuit 230 through path S2Y1 of the switch 225 and the path S4Y2 of switch 235. The correction circuit 230 corrects the drift in the second frequency. The second frequency after the correction in the drift can be further provided for up-conversion of the baseband signal in the low power transmit mode. In one embodiment, the second frequency is divided by a predetermined factor using the frequency divider 240. The second frequency that is divided is further provided to the correction circuit 230 through the path S2Y1 of the switch 225 and the path S4Y2 of the switch 235.

In the receive mode, the frequency of the oscillator 210 (second frequency) can drift. The signal having the second frequency is provided to the correction circuit 230 through path S3Y2 of the switch 235. The correction circuit 230 corrects the drift in the second frequency. The second frequency after the correction in the drift can be further provided for down-conversion of an input RF signal in the receive mode. In one embodiment, the second frequency is divided by a predetermined factor using the frequency divider 240. The second frequency that is divided is further provided to the correction circuit 230 through the path S3Y2 of the switch 235.

The paths S1Y1 and S2Y1 of the switch 225 and the paths S3Y2 and S4Y2 of the switch 235 can be selected based on one or more control signals. A control signal can be generated internally in the oscillator circuit 105 or using an external circuit.

In one embodiment, the control signal can be generated using a microcontroller coupled to the oscillator circuit 105. In one example, the microcontroller generates the control signal in the high power transmit mode and sends the control signal to switches (switch 225 and switch 235) and the oscillators (oscillator 205 and oscillator 210) to control the path S1Y1 of the switch 225 and the path S4Y2 of the switch 235. In another example, the microcontroller generates the control signal in the low power transmit mode and sends the control signal to switches (switch 225 and switch 235) and the oscillator 210 to control the path S2Y1 of the switch 225 and the path S4Y2 of the switch 235. In yet another example, the microcontroller generates the control signal in the receive mode and sends the control signal to the switch 235 and the oscillator 210 to control the path S3Y2 of the switch 235.

In another embodiment, the control signal can be based on the power level of a baseband signal in the transmit mode and the RF input signal in the receive mode.

In one embodiment, the correction circuit 230 can include a phase error detector 245 that is coupled to an integrator 250. The phase error detector 245 generates an error signal corresponding to magnitude of the drift in at least one of the first frequency or the second frequency. The phase error detector 245 receives the signal having the desired frequency and a reference signal and further generates the error signal. The integrator 250 acts as a low pass filter to filter the error signal and further drive the oscillator 210. In one example, the oscillator 210 reduces the second frequency when there is an increase in the error signal, thereby compensating for the drift in at least one of the first frequency and the second frequency.

It is noted that the correction circuit 230 can include other elements than that described in the disclosure.

The correction circuit 230, the oscillator 210, and the frequency divider 240 can be collectively referred to as a phase locked loop. In one example, the correction circuit 230 corrects a drift in the frequency of the signal at the output port Y2 by controlling the oscillator 210, thereby providing a stable local oscillator signal to the transceiver 100 of FIG. 1.

The oscillator 205 and the oscillator 210 can generate signals having frequencies that satisfy predetermined criteria. In one example, the predefined criteria includes that the frequencies should not have an integer relation between each other. In one example, the oscillator 205 can generate the first frequency as 3.6 GHz and the oscillator 210 can generate the second frequency as 6 GHz by selecting a frequency $F_{lo}$=2.4 GHz. In one example, the frequency 2.4 GHz can be selected to place unwanted sidebands generated by intermodulation of oscillator harmonics (intermod's) in free bands not used by any adjacent transceiver. The frequency $F_{lo}$ can be selected based on a frequency plan, for example the frequency plan illustrated in Table 1.

TABLE 1

| Oscillator 210 | Oscillator 205 | Intermod |
|---|---|---|
| +1 | −1 | 2.4 GHz |
| +1 | −2 | 1.2 GHz |
| +1 | −3 | 4.8 GHz |
| +2 | −1 | 8.4 GHz |
| +2 | −3 | 1.2 GHz |
| +2 | −4 | 2.4 GHz |
| +3 | −4 | 3.6 GHz |
| +4 | −6 | 2.4 GHz |
| +4 | −7 | 1.2 GHz |
| +5 | −8 | 1.2 GHz |

Referring to the Table 1 now, the frequency plan for an ISM transceiver, for example the transceiver 100, includes the intermod's generated by mixing of oscillator 205 and oscillator 210 outputs. In one example, an intermod of 2.4 GHz is generated when oscillator 205 output is at harmonic −1 and oscillator 210 output is at harmonic +1.

Figure 3:
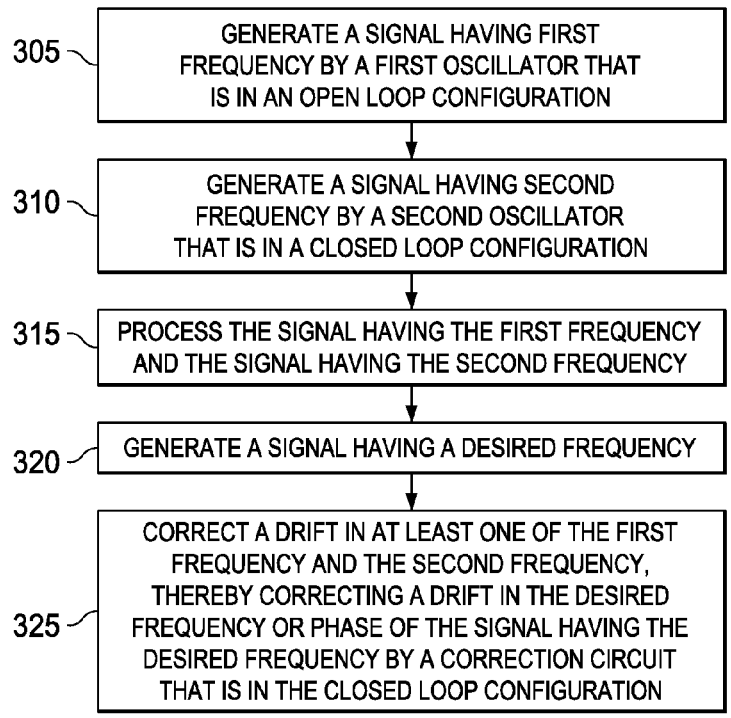
FIG. 3 is a flow chart illustrating a method for correcting a drift in frequency in an oscillator circuit, in accordance with one embodiment.

FIG. 3 illustrates a method for correcting a drift in frequency in an oscillator circuit.

The oscillator circuit can be present in a transceiver, for example, the transceiver 100, of a mobile phone. The oscillator circuit can include a first oscillator, for example the oscillator 205 and a second oscillator, for example the oscillator 210.

At step 305, a signal having a first frequency is generated by the first oscillator. The first oscillator is in an open loop configuration. The first frequency can be prone to drift. The drift can be due to temperature variations or due to interference caused because of harmonics of other frequencies in the transceiver.

At step 310, a signal having a second frequency is generated by the second oscillator. The second oscillator is in a closed loop configuration. The second frequency can also be prone to drift.

At step 315, the signal having the first frequency and the signal having the second frequency are processed to generate a third frequency. In one embodiment, the transceiver can include a mixer, for example the mixer 215 that adds the first frequency and the second frequency to provide the third frequency. The mixer 215 can be in the closed loop configuration.

At step 320, a signal having a desired frequency is generated. The combination of the first frequency and the second frequency can result in one or more frequency components. In one embodiment, the frequency components are not desired and can be filtered out using a filter, for example the filter 220. The filter 220 removes the frequency components to provide the signal having the desired frequency. The filter 220 can be in the closed loop configuration. In other embodiments, the desired frequency can be the third frequency. The drift in either the first frequency or second frequency can cause a drift in the desired frequency or a drift in phase of the signal having the desired frequency.

At step 325, the drift in at least one of the first frequency and the second frequency is corrected, thereby correcting the drift in the desired frequency or the drift in the phase of the signal having the desired frequency. The drift in at least one of the first frequency and the second frequency is corrected by a correction circuit, for example the correction circuit 230. The correction circuit 230 is coupled to the oscillator 210 and is also included in the closed loop configuration.

In one example, the oscillator 205 and the oscillator 210 in conjunction with the correction circuit 230 can be used to minimize power amplifier pulling in transmitter portion of the transceiver 100. The power amplifier pulling can be due to the harmonics generated in the transceiver 100. In another example, the oscillator 205 and the oscillator 210 in conjunction with the correction circuit 230 can enable the transceiver 100 to operate in multiple frequency bands without interference due to harmonics of adjacent frequency bands.

In the foregoing discussion, the term "coupled" refers to either a direct electrical connection between the devices connected or an indirect connection through intermediary devices. The term "signal" means at least one current, voltage, charge, data, or other signal.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. An oscillator circuit comprising:
   a first oscillator in an open loop configuration that generates a signal having a first frequency;
   a second oscillator that generates a signal having a second frequency;
   a mixer coupled to the first oscillator and the second oscillator, and responsive to the signal having the first frequency and the signal having the second frequency to provide a signal having a third frequency and one or more frequency components;
   a filter coupled to the mixer, and responsive to the signal from the mixer to attenuate the one or more frequency components and provide a signal having a desired frequency;
   a correction circuit coupled to the second oscillator and the filter to correct a drift in at least one of the first frequency and the second frequency by controlling the second frequency, thereby correcting the drift in the third frequency and the desired frequency; and
   a switching circuit coupled to the correction circuit for enabling the correction circuit to correct the drift in the frequency of the output signal.

2. An oscillator circuit comprising:
a first oscillator that generates a signal having a first frequency;
a second oscillator that generates a signal having a second frequency;
a mixer coupled to the first oscillator and the second oscillator, and responsive to the signal having the first frequency and the signal having the second frequency to provide a signal having a third frequency and one or more frequency components;
a filter coupled to the mixer, and responsive to the signal from the mixer to attenuate the one or more frequency components and provide a signal having a desired frequency;
a correction circuit coupled to the second oscillator and the filter to correct a drift in at least one of the first frequency and the second frequency by controlling the second frequency, thereby correcting the drift in the third frequency and the desired frequency;
a first switch coupled to the filter, the second oscillator and the correction circuit; and
a second switch coupled to the correction circuit, the first switch and the second oscillator, and that is configurable, in conjunction with the first switch, to render the correction circuit to correct the drift in at least one of the first frequency and the second frequency by controlling the second frequency.

3. The oscillator circuit as claimed in claim 2, wherein the correction circuit comprises:
a phase error detector that generates an error signal corresponding to magnitude of the drift in the third frequency and the desired frequency; and
an integrator coupled to the phase error detector to filter the error signal.

4. The oscillator circuit as claimed in claim 3 and further comprising a frequency divider, coupled to the second oscillator, that divides the second frequency by a predetermined factor.

5. The oscillator circuit as claimed in claim 4, wherein the frequency divider, the correction circuit and the second oscillator in combination acts as a phase locked loop.

6. The oscillator circuit as claimed in claim 5, wherein the first switch and the second switch are configured based on one or more control signals, the one or more control signals being a function of power level of an input radio frequency signal.

7. The oscillator circuit as claimed in claim 6, wherein the first switch and the second switch are responsive to the one or more control signals to operate the oscillator circuit in at least one of:
a high power transmit mode;
a low power transmit mode; and
a receive mode.

8. The oscillator circuit as claimed in claim 7, wherein the first switch and the second switch are responsive to the one or more control signals to render the correction circuit to correct the drift in at least one of the first frequency and the second frequency in the high power transmit mode.

9. The oscillator circuit as claimed in claim 8, wherein the first switch and the second switch are responsive to the one or more control signals to render the correction circuit to correct the drift in the second frequency in the low power transmit mode.

10. The oscillator circuit as claimed in claim 9, wherein the second switch is responsive to the one or more control signals to render the correction circuit to correct the drift in the second frequency in the receive mode.

11. The oscillator circuit as claimed in claim 10, wherein the first switch and the second switch are uni-directional switches and comprise:
a plurality of input ports; and
an output port.

12. The oscillator circuit as claimed in claim 11, wherein the first switch and the second switch are metal oxide semiconductor transistor switches.

13. A multi-band transceiver, comprising:
an oscillator circuit, said oscillator circuit comprising:
a first oscillator that generates a signal having a first frequency;
a second oscillator that generates a signal having a second frequency;
a mixer coupled to the first oscillator and the second oscillator, and responsive to the signal having the first frequency and the signal having the second frequency to provide a signal having a third frequency and one or more frequency components;
a filter coupled to the mixer, and responsive to the signal from the mixer to attenuate the one or more frequency components and provide a signal having a desired frequency; and
a correction circuit coupled to the second oscillator and the filter to correct a drift in at least one of the first frequency and the second frequency by controlling the second frequency, thereby correcting the drift in the third frequency and the desired frequency.

14. An oscillator circuit comprising:
a first oscillator that generates a signal having a first frequency;
a second oscillator that generates a signal having a second frequency;
a mixer coupled to the first oscillator and the second oscillator, and responsive to the signal having the first frequency and the signal having the second frequency to provide a signal having a third frequency and one or more frequency components;
a filter coupled to the mixer, and responsive to the signal from the mixer to attenuate the one or more frequency components and provide a signal having a desired frequency;
a first switch coupled to the filter to selectively output the signal having the desired frequency;
a phase error detector that generates an error signal corresponding to magnitude of a drift in the third frequency and the desired frequency;
an integrator coupled to the phase error detector to filter the error signal; and
a second switch coupled between the phase error detector and the first switch, and that is configurable, in conjunction with the first switch, to render the phase error detector, the integrator and the second oscillator to correct the drift in the third frequency and the desired frequency by controlling the second frequency.

15. An oscillator circuit comprising:
a first oscillator in an open loop configuration;
a second oscillator in a closed loop configuration;
a mixer coupled to the first oscillator and the second oscillator, and responsive to signals from the first oscillator and the second oscillator to provide an output signal; and
a correction circuit coupled to the second oscillator and the mixer, and responsive to the output signal to correct a drift in a frequency of the output signal by controlling output of the second oscillator; and a switching circuit coupled to the correction circuit for enabling the correction circuit to correct the drift in the frequency of the output signal.

16. An oscillator circuit comprising:
a first oscillator in an open loop configuration;
a second oscillator in a closed loop configuration;
a mixer coupled to the first oscillator and the second oscillator, and responsive to signals from the first oscillator and the second oscillator to provide an output signal;
a correction circuit coupled to the second oscillator and the mixer, and responsive to the output signal to correct a drift in a frequency of the output signal by controlling output of the second oscillator;
a first switch coupled to the mixer; and
a second switch coupled between the first switch and the correction circuit, and that is configurable, in conjunction with the first switch, to render the correction circuit to correct the drift in the frequency of the output signal.

17. The oscillator circuit as claimed in claim 16, wherein the first switch and the second switch are configured based on one or more control signals, the one or more control signals being a function of power level of an input radio frequency signal.

18. The oscillator circuit as claimed in claim 17, wherein the first switch and the second switch are controlled using a microcontroller.

19. The oscillator circuit as claimed in claim 17, wherein the second oscillator, the mixer, the correction circuit, the first switch, and the second switch form the closed loop configuration.

20. An oscillator circuit comprising:
a first oscillator in an open loop configuration;
a second oscillator in a closed loop configuration;
a mixer coupled to the first oscillator and the second oscillator, and responsive to signals from the first oscillator and the second oscillator to provide an output signal; and
a correction circuit coupled to the second oscillator and the mixer, and responsive to the output signal to correct a drift in a frequency of the output signal by controlling output of the second oscillator, the correction circuit comprising:
a phase error detector that generates an error signal corresponding to magnitude of the drift in the frequency of the output signal; and
an integrator coupled to the phase error detector to filter the error signal; and
a switching circuit coupled to the correction circuit for enabling the correction circuit to correct the drift in the frequency of the output signal.

* * * * *